US012578177B2

(12) United States Patent
Deak et al.

(10) Patent No.: US 12,578,177 B2
(45) Date of Patent: Mar. 17, 2026

(54) LOW-MAGNETIC-FIELD MAGNETORESISTIVE ANGLE SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 364 days.

(21) Appl. No.: 18/551,379

(22) PCT Filed: Mar. 16, 2022

(86) PCT No.: PCT/CN2022/081199
§ 371 (c)(1),
(2) Date: Apr. 5, 2024

(87) PCT Pub. No.: WO2022/194205
PCT Pub. Date: Sep. 22, 2022

(65) Prior Publication Data
US 2024/0255271 A1      Aug. 1, 2024

(30) Foreign Application Priority Data
Mar. 19, 2021    (CN) .......................... 202110297617.4

(51) Int. Cl.
G01B 7/30            (2006.01)
G01R 33/00          (2006.01)
G01R 33/09          (2006.01)
(52) U.S. Cl.
CPC ........... *G01B 7/30* (2013.01); *G01R 33/0094* (2013.01); *G01R 33/093* (2013.01)
(58) Field of Classification Search
CPC .... G01B 7/30; G01R 33/0094; G01R 33/093; G01R 33/098; H10N 50/10
See application file for complete search history.

(56) References Cited

U.S. PATENT DOCUMENTS 6,622,391 B1     9/2003  Shirai et al.
7,592,803 B1     9/2009  Guo et al.
(Continued)

FOREIGN PATENT DOCUMENTS

CN        201653354 U     11/2010
CN        102280574 A     12/2011
(Continued)

OTHER PUBLICATIONS

"Chinese Application No. 202110297617.4, First Office Action mailed Aug. 1, 2022", (Aug. 1, 2022), 8 pgs.
(Continued)

*Primary Examiner* — Alvaro E Fortich
(74) *Attorney, Agent, or Firm* — Schwegman Lundberg & Woessner, P.A.

(57) ABSTRACT

Disclosed in the embodiments of the present invention is a low-magnetic-field magnetoresistive angle sensor. The sensor comprises: a substrate located in an X-Y plane, and a magnetoresistive sensing unit located on the substrate. The magnetoresistive sensing unit comprising a multi-layer thin film structure. The multi-layer thin film structure comprises at least a stack of a free layer, a barrier layer, and a reference layer. The magnetoresistive sensing unit has an oval shape. The oval-shaped free layer has a long axis Ly, a short axis Lx, and a thickness Lz. Additionally the free layer has a saturation magnetic field, a shape anisotropy demagnetizing field, and a magnetocrystalline anisotropy field in the X direction. When an external magnetic field rotates by 0-360° in the X-Y plane, the magnetocrystalline anisotropy field is compensated by the shape demagnetizing field to cause the effective anisotropy field of the free layer to be close to 0, such that the external magnetic field has a low working magnetic field value close to that of the saturation magnetic field of the free layer material. The embodiments of the (Continued)

present invention can improve the accuracy of angle measurement of a magnetoresistive angle sensor. Additionally because the required external magnetic field is low, the sensor can be implemented at low cost.

10 Claims, 6 Drawing Sheets

(56)                    References Cited

U.S. PATENT DOCUMENTS

| | | | |
|---|---|---|---|
| 9,575,143 B2 * | 2/2017 | Deak | G01R 33/098 |
| 2007/0063236 A1 * | 3/2007 | Huai | G11C 11/161 |
| | | | 257/E27.005 |
| 2014/0021571 A1 * | 1/2014 | Lei | G01B 7/30 |
| | | | 257/427 |
| 2014/0251506 A1 | 9/2014 | Evans, III et al. | |
| 2015/0130455 A1 * | 5/2015 | Bai | G01R 33/022 |
| | | | 324/252 |
| 2018/0113179 A1 * | 4/2018 | Deak | G01R 31/2829 |

FOREIGN PATENT DOCUMENTS

| | | | |
|---|---|---|---|
| CN | 102460575 A | | 5/2012 |
| CN | 104776794 | | 7/2015 |
| CN | 105047814 A | | 11/2015 |
| CN | 108259032 A | | 7/2018 |
| CN | 112097800 A | | 12/2020 |
| CN | 113063344 A | | 7/2021 |
| JP | H08271600 A | | 10/1996 |
| JP | 2006214910 A | | 8/2006 |
| WO | WO-2022194205 A1 | | 9/2022 |

OTHER PUBLICATIONS

"Chinese Application No. 202110297617.4, First Search dated Jul. 11, 2022", (Jul. 11, 2022), 2 pgs.

"Chinese Application No. 202110297617.4, Notification to Grant Patent Right for Invention mailed Aug. 30, 2022", (Aug. 30, 2022), 3 pgs.

"International Application No. PCT/CN2022/081199, International Search Report and Written Opinion dated May 25, 2022", (May 25, 2022), 9 pgs.

* cited by examiner

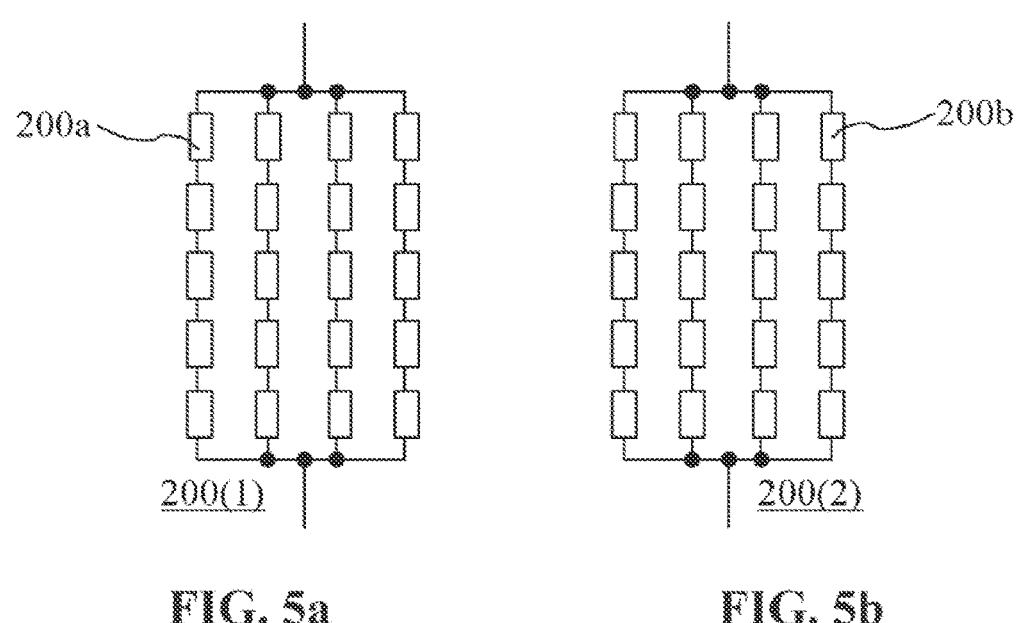
FIG. 5a                    FIG. 5b
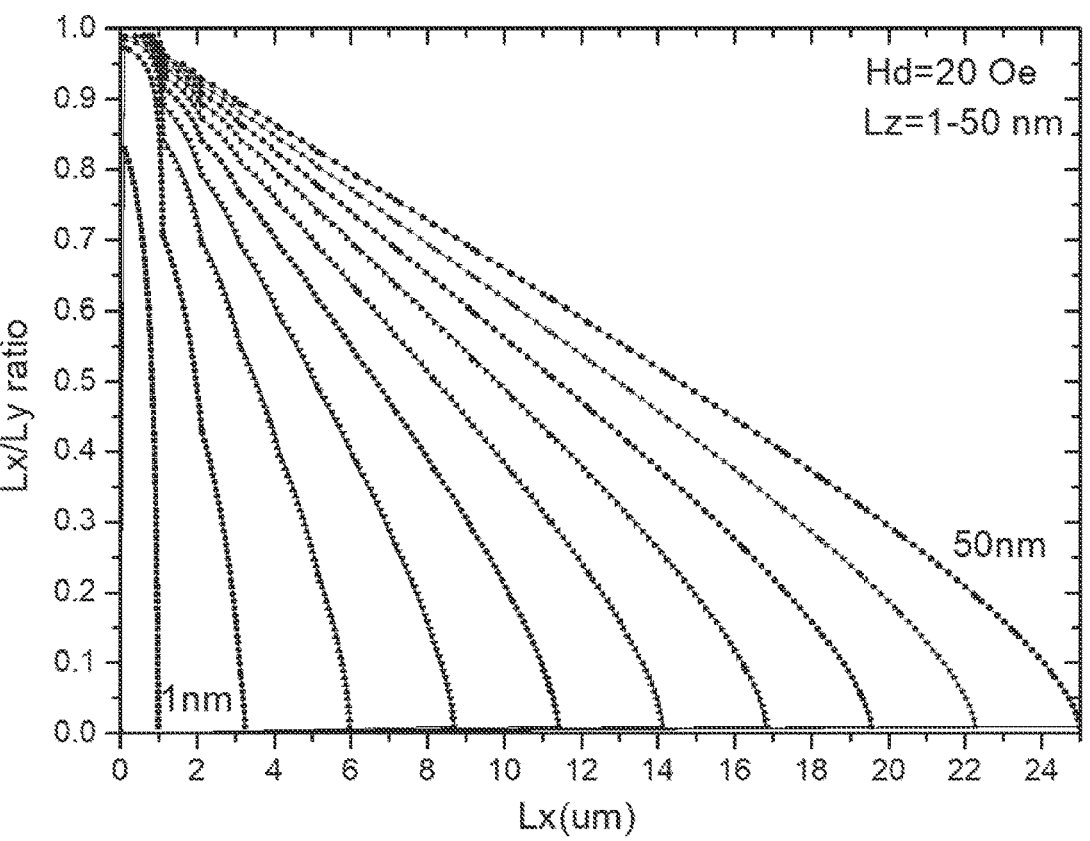
FIG. 6

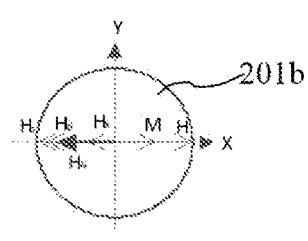
FIG. 10
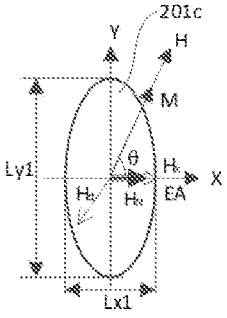
FIG. 11a
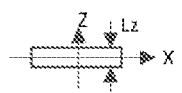
FIG. 11b
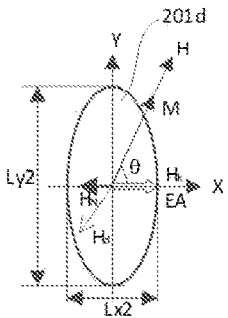
FIG. 11c
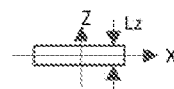
FIG. 11d
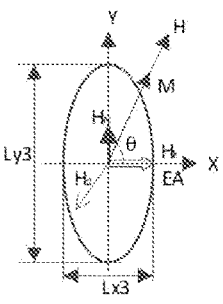
FIG. 12a
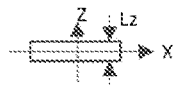
FIG. 12b
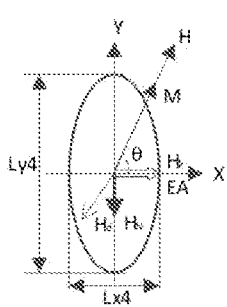
FIG. 12c
FIG. 12d

LOW-MAGNETIC-FIELD MAGNETORESISTIVE ANGLE SENSOR

PRIORITY CLAIM TO RELATED APPLICATIONS

This application is a U.S. national stage filing under 35 U.S.C. § 371 from International Application No. PCT/CN2022/081199, filed on 16 Mar. 2022, and published as WO2022/194205 on 22 Sep. 2022, which claims the benefit under 35 U.S.C. 119 to Chinese Application No. 202110297617.4, filed on 19 Mar. 2021, the benefit of priority of each of which is claimed herein, and which applications and publication are hereby incorporated herein by reference in their entirety.

TECHNICAL FIELD

Embodiments of the present invention relate to the technical field of magnetic sensors, and particularly relate to a low-magnetic-field magnetoresistive angle sensor.

BACKGROUND

Spin valve magnetoresistive angle sensing units such as TMR or GMR are usually round. In normal use, the value of an external magnetic field H is far larger than a saturation magnetic field $H_s$ of a free layer (FL), such that a magnetic moment M of the free layer (FL) and the external magnetic field H will be consistent in direction.

However, although it is guaranteed that the magnetic moment $M_s$ of the free layer (FL) and H are consistent in direction by adding the external magnetic field H, the deflection angles of other film layers in the magnetoresistive angle sensing unit may be increased along with increase of the amplitude of the H, and thus extra measurement angle errors may be caused. Additionally, a high external magnetic field H further requires a strong magnet, the price is higher, and as a result, the use cost is increased.

SUMMARY

Embodiments of the present invention provide a low-magnetic-field magnetoresistive angle sensor, and aim to solve the problems of low measurement accuracy and high cost of conventional angle sensors.

An embodiment of the present invention provides a low-magnetic-field magnetoresistive angle sensor, including:

a substrate located in an X-Y plane; and a magnetoresistive sensing unit located on the substrate, the magnetoresistive sensing unit including a multi-layer thin film structure, the multi-layer thin film structure including at least a stack of a free layer, a barrier layer, and a reference layer; wherein the magnetoresistive sensing unit has an oval shape; the oval-shaped free layer has a long axis Ly, a short axis Lx, and a thickness Lz; the free layer has a saturation magnetic field, a shape anisotropic demagnetizing field, and a magnetocrystalline anisotropic field in the X direction; when an external magnetic field rotates by 0-360° in the X-Y plane, the magnetocrystalline anisotropic field is compensated by the shape anisotropic demagnetizing field to cause the effective anisotropic field of the free layer to be close to 0, such that the external magnetic field has a low working magnetic field value close to that of the saturation magnetic field of the free layer material.

Further, the magnetoresistive sensing unit includes a push magnetoresistive sensing unit and a pull magnetoresistive sensing unit; a free layer of the push magnetoresistive sensing unit and a free layer of the pull magnetoresistive sensing unit have positive and negative X-direction Neel coupling magnetic fields; and the Neel coupling magnetic fields of the push magnetoresistive sensing unit and the pull magnetoresistive sensing unit are compensated by the magnetocrystalline anisotropic field and the shape anisotropic demagnetizing field of the corresponding free layers respectively.

Further, a plurality of push magnetoresistive sensing units are electrically connected to form a push magnetoresistive sensing unit string; a plurality of pull magnetoresistive sensing units are electrically connected to form a pull magnetoresistive sensing unit string; and the push magnetoresistive sensing unit string and the pull magnetoresistive sensing unit string are connected to form a push-pull magnetoresistive angle sensor of a full-bridge structure or a half-bridge structure.

Further, the shape anisotropic demagnetizing field of the free layer is determined by shape anisotropy factors (Nx, Ny), and the magnetocrystalline anisotropic field of the free layer is determined by a magnetocrystalline anisotropy constant K1;

$Nx=Ny+K1/M_s^2$, $M_s$ represents a saturation magnetic moment of the free layer, Nx represents an X-direction shape anisotropy factor, and Ny represents a Y-direction shape anisotropy factor.

Further, the shape anisotropic demagnetizing field of the free layer is determined by shape anisotropy factors (Nx, Ny), and the magnetocrystalline anisotropic field of the free layer is determined by a magnetocrystalline anisotropy constant K1;

for the push magnetoresistive sensing unit, $Nx=Ny+K1/M_s^2+2*H_N/M_s$; for the pull magnetoresistive sensing unit, $Nx=Ny+K1/M_s^2-2*H_N/M_s$; and $M_s$ represents a saturation magnetic moment of the free layer, Nx represents a X-direction shape anisotropy factor, Ny represents a Y-direction shape anisotropy factor, and $H_N$ represents the Neel coupling magnetic field of the free layer.

Further, the multi-layer thin film structure includes a seed layer, the free layer, the barrier layer, the reference layer, a metal layer, a pinning layer, an antiferromagnetic layer and an insulating layer along the direction in which the substrate points to the magnetoresistive sensing unit.

Further, the multi-layer thin film structure includes a seed layer, an antiferromagnetic layer, a pinning layer, a metal layer, the reference layer, the barrier layer, the free layer and an insulating layer along the direction in which the substrate points to the magnetoresistive sensing unit, and the reference layer is flattened by off-axis ion beam milling.

Further, the reference layer is of a double-layer composite structure or an SAF multi-layer composite structure.

Further, the barrier layer is a conductive layer prepared from ruthenium or copper, or the barrier layer is an insulating layer prepared from aluminum oxide or magnesium oxide, and the free layer is a multi-layer thin film composed of two or more alloys of ferronickel, cobalt-iron-boron and cobalt-iron.

Further, the magnetocrystalline anisotropic field is smaller than 20 Oe;

the ratio Lx/Ly of the short axis to the long axis is in the range of 0.5<Lx/Ly<0.95, the thickness Lz is in the range of 5 nm<Lz<200 nm, and the short axis Lx is in the range of 0.5 μm<Lx<50 μm; and the difference between the orientation angle of the shape anisotropic demagnetizing field and the orientation angle of the magnetocrystalline anisotropic field is 90°.

According to the embodiments of the present invention, when an external magnetic field rotates by 0-360° in the X-Y plane, the magnetocrystalline anisotropic field will be compensated by the shape anisotropic demagnetizing field in the free layer, so that the free layer has an effective anisotropic field close to 0, and the corresponding external magnetic field has a low magnetic field value close to that of the saturation magnetic field of the free layer material. Thus, the angle measurement error of the magnetoresistive angle sensor may be reduced, and the angle measurement accuracy may be improved. In addition, the external magnetic field is low, so it is not needed to configure a strong magnet, and the magnetoresistive angle sensor can be implemented at low cost.

BRIEF DESCRIPTION OF THE DRAWINGS

In order to provide a clearer explanation of the embodiments of the present invention or the technical solutions in the prior art, a brief introduction will be made to the accompanying drawings required in the embodiments or description of the prior art. It is evident that although the accompanying drawings in the following description are some specific embodiments of the present invention, for those skilled in the art, the basic concepts of device structure, driving method and manufacturing method disclosed and suggested by various embodiments of the present invention can be expanded and extended to other structures and drawings, which are undoubtedly within the scope of the claims of the present invention.

FIG. 5a is a schematic diagram of a push magnetoresistive sensing unit string in a low-magnetic-field magnetoresistive angle sensor according to an embodiment of the present invention.

FIG. 5b is a schematic diagram of a pull magnetoresistive sensing unit string in a low-magnetic-field magnetoresistive angle sensor according to an embodiment of the present invention.

FIG. 6 is a (Lx/Ly)–Lx two-dimensional diagram of free layers having different Lz values in an oval magnetoresistive sensing unit.

FIG. 10 is a magnetization diagram of a free layer in a pull magnetoresistive sensing unit according to an embodiment of the present invention.

FIG. 11a-FIG. 11d are magnetization diagrams of an oval free layer; FIG. 11a is an X-Y plane magnetization diagram of an oval push free layer; FIG. 11b is an X-Z plane magnetization diagram of an oval push free layer; FIG. 11c is an X-Y plane magnetization graph of an oval pull free layer;

FIG. 11d is an X-Z plane magnetization graph of an oval pull free layer;

FIG. 12a-FIG. 12d are magnetization diagrams of another oval free layer; FIG. 12a is an X-Y plane magnetization graph of an oval push free layer; FIG. 12b is an X-Z plane magnetization diagram of an oval push free layer; FIG. 12c is an X-Y plane magnetization diagram of an oval pull free layer; FIG. 12d is an X-Z plane magnetization diagram of an oval pull free layer;

DETAILED DESCRIPTION

In order to make the purpose, technical solution, and advantages of the present invention clearer, the technical scheme of the present invention will be clearly and completely described by means of embodiments with reference to the drawings in the embodiments of the present invention. Obviously, the described embodiments are part of the embodiments of the present invention, but not all of them. Based on the basic concepts disclosed and prompted by the embodiments in the present invention, all other embodiments obtained by those skilled in the art belong to the scope of protection of the present invention.

Figure 1:
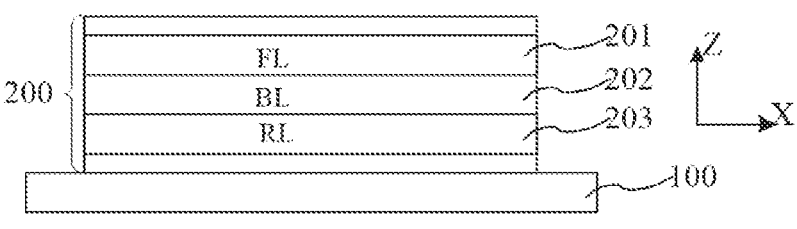
FIG. 1 is a schematic diagram of a low-magnetic-field magnetoresistive angle sensor according to an embodiment of the present invention.
Figure 2:
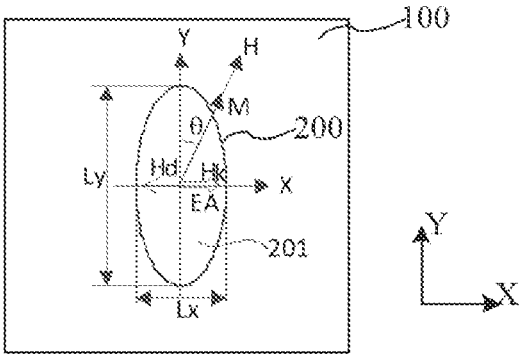
FIG. 2 is an X-Y plane magnetization diagram of a low-magnetic-field magnetoresistive angle sensor according to an embodiment of the present invention.
Figure 3:
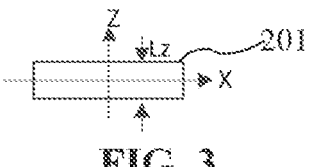
FIG. 3 is an X-Z plane magnetization diagram of a low-magnetic-field magnetoresistive angle sensor according to an embodiment of the present invention.

FIG. 1 is a schematic diagram of a low-magnetic-field magnetoresistive angle sensor according to an embodiment of the present invention; FIG. 2 is an X-Y plane magnetization diagram of a low-magnetic-field magnetoresistive angle sensor according to an embodiment of the present invention; and FIG. 3 is an X-Z plane magnetization diagram of a low-magnetic-field magnetoresistive angle sensor according to an embodiment of the present invention. The low-magnetic-field magnetoresistive angle sensor according to an embodiment of the present invention includes: a substrate 100 located in an X-Y plane; and a magnetoresistive sensing unit 200 located on the substrate 100, the magnetoresistive sensing unit 200 including a multi-layer thin film structure, the multi-layer thin film structure including at least a stack of a free layer (FL) 201, a barrier layer (BL) 202 and a reference layer (RL) 203. The magnetoresistive sensing unit 200 has an oval shape; the oval-shaped free layer 201 has a long axis Ly, a short axis Lx, and a thickness Lz; and the free layer 201 has a saturation magnetic field Hs, a shape anisotropic demagnetizing field $H_d$, a magnetocrystalline anisotropic field $H_k$ in the X direction; when an external magnetic field H rotates by 0-360° in the X-Y plane, the magnetocrystalline anisotropic field $H_k$ is compensated by the shape anisotropic demagnetizing field $H_d$ to cause the effective anisotropic field of the free layer 201 to be close to 0, such that the external magnetic field H has a low working magnetic field value close to that of the saturation magnetic field $H_s$ of the free layer 201 material.

In this embodiment, optionally, the substrate 100 is a wafer, and the substrate 100 is provided with one or more magnetoresistive sensing units 200. Each magnetoresistive sensing unit 200 includes a multi-layer thin film structure, and the multi-layer thin film structure includes at least a stack of the free layer 201, the barrier layer 202 and the reference layer 203. It is to be understood that the free layer 201, the barrier layer 202 and the reference layer 203 may be stacked according to the sequence shown in FIG. 2, and may also be stacked according to other sequences, which is not limited to this. The magnetoresistive sensing unit 200 is in the oval shape, the long axis of the oval shape is parallel to the Y direction, the short axis of the oval shape is parallel to the X direction, and the thickness of the oval shape is parallel to the Z direction; the long axis of the oval shape of the free layer 201 is Ly and is parallel to the Y direction, the short axis of the oval shape is Lx and is parallel to the X direction, and the thickness of the oval shape is Lz and is parallel to the Z direction; and in other embodiments, the magnetoresistive sensing unit may be selected to be in other shapes, which is not limited to this.

The free layer 201 has the saturation magnetic field $H_s$, the shape anisotropic demagnetizing field $H_d$ and the magnetocrystalline anisotropic field $H_k$ in the X direction. When the external magnetic field H rotates by 0-360° in the X-Y plane, the magnetocrystalline anisotropic field $H_k$ and the shape anisotropic demagnetizing field $H_d$ are opposite in direction and may compensate each other, namely, the shape anisotropic demagnetizing field $H_d$ may compensate the magnetocrystalline anisotropic field $H_k$. If the magnetic field value of the shape anisotropic demagnetizing field $H_d$ is close to that of the magnetocrystalline anisotropic field $H_k$, the free layer 201 will have an effective anisotropic field close to 0. The free layer 201 further has the saturation magnetic field $H_s$, and if the free layer 201 has the effective anisotropic field close to 0, the external magnetic field H is close to the saturation magnetic field $H_s$ when the external magnetic field H rotates by 0-360° in the X-Y plane. It is known that the magnetic field value of the saturation magnetic field $H_s$ of the free layer 201 is low, so the external magnetic field H has the low magnetic field value close to the saturation magnetic field $H_s$ of the free layer 201.

It is to be noted that mutual compensation of $H_d$ and $H_k$ is achieved in the following mode: the free layer is processed by a magnetic field annealing processing technology, or the free layer is grown through a sputtering film growing technology with a bias magnetic field; the formed free layer film may have a uniaxial magnetocrystalline anisotropic field $H_k$, and the anisotropy is in a specific direction; and on the other hand, the free layer is arranged to be in the oval shape instead of a round shape, the shape anisotropic demagnetizing field $H_d$ in a specific direction is obtained by setting the size of the long axis Ly and the size of the short axis Lx of the oval, and thus $H_k$ and $H_d$ are mutually compensated.

Optionally, the magnetoresistive angle sensor may be TMR or GMR, but is not limited to TMR or GM R.

According to the embodiment of the present invention, when the external magnetic field rotates by 0-360° in the X-Y plane, the magnetocrystalline anisotropic field will be compensated by the shape anisotropic demagnetizing field in the free layer, so that the free layer has an effective anisotropic field close to 0, and the corresponding external magnetic field has a low magnetic field value close to that of the saturation magnetic field of the free layer. Thus, the angle measurement error of the magnetoresistive angle sensor may be reduced, and the angle measurement accuracy may be improved. Additionally, the external magnetic field is low, so it is not needed to configure a strong magnet, and the magnetoresistive angle sensor can be implemented at low cost.

Figure 4:
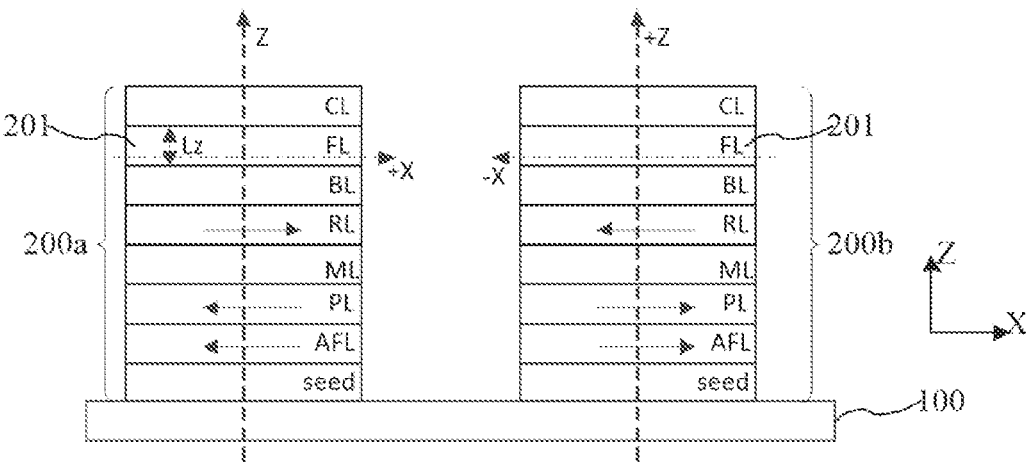
FIG. 4 is a schematic diagram of a multi-layer stacking structure in a low-magnetic-field magnetoresistive angle sensor according to an embodiment of the present invention.

Exemplarily, FIG. 4 is a schematic diagram of a multi-layer stacking structure in a low-magnetic-field magnetoresistive angle sensor according to an embodiment of the present invention. As shown in FIG. 4, optionally, the magnetoresistive sensing unit includes a push magnetoresistive sensing unit 200a and a pull magnetoresistive sensing unit 200b; the free layer 201 of the push magnetoresistive sensing unit 200a and the free layer 201 of the pull magnetoresistive sensing unit 200b have positive and negative X-direction Neel coupling magnetic fields $H_N$; and the Neel coupling magnetic fields $H_N$ of the push magnetoresistive sensing unit 200a and the pull magnetoresistive sensing unit 200b are compensated by the magnetocrystalline anisotropic field $H_k$ and the shape anisotropic demagnetizing field $H_d$ of the corresponding free layers 201 respectively.

In this embodiment, the magnetoresistive sensing unit is a push-pull magnetoresistive sensing unit. Optionally, the free layer 201 of the push magnetoresistive sensing unit 200a has a positive X-direction Neel coupling magnetic field $H_N$, and the free layer 201 of the pull magnetoresistive sensing unit 200b has a negative X-direction Neel coupling magnetic field $H_N$. In other embodiments, optionally, the free layer of the push magnetoresistive sensing unit has a –X-direction Neel coupling magnetic field, and the free layer of the pull magnetoresistive sensing unit has a +X-direction Neel coupling magnetic field.

The Neel coupling magnetic field $H_N$ of the push magnetoresistive sensing unit 200a is compensated by the magnetocrystalline anisotropic field $H_k$ and the shape anisotropic field $H_d$ of the free layer 201; and the Neel coupling magnetic field $H_N$ of the pull magnetoresistive sensing unit 200b is compensated by the magnetocrystalline anisotropic field $H_k$ and the shape anisotropic field $H_d$ of the free layer 201.

FIG. 5a and FIG. 5b are schematic diagrams of a low-magnetic-field magnetoresistive angle sensor according to an embodiment of the present invention. As shown in FIG. 5a, optionally, a plurality of push magnetoresistive sensing units 200a may be electrically connected to form a push magnetoresistive sensing unit string 200(1); as shown in FIG. 5b, optionally, a plurality of pull magnetoresistive sensing units 200b may be electrically connected to form a pull magnetoresistive sensing unit string 200(2); and the push magnetoresistive sensing unit string 200(1) and the pull magnetoresistive sensing unit string 200(2) are connected to form a push-pull magnetoresistive angle sensor of a full-bridge structure or a half-bridge structure.

In this embodiment, the magnetoresistive angle sensor is a push-pull magnetoresistive angle sensor; the push-pull magnetoresistive angle sensor includes the push magnetoresistive sensing unit string 200(1) and the pull magnetoresistive sensing unit string 200(2); and the push magnetoresistive sensing unit string 200(1) and the pull magnetoresistive sensing unit string 200(2) are connected to form a full-bridge structure, or the push magnetoresistive sensing unit string 200(1) and the pull magnetoresistive sensing unit string 200(2) are connected to form a half-bridge structure.

As shown in FIG. 5a, the push magnetoresistive sensing unit string 200(1) is formed by connecting the plurality of push magnetoresistive sensing units 200a in series and in parallel; and as shown in FIG. 5*b*, the pull magnetoresistive sensing unit string 200(2) is formed by connecting the plurality of pull magnetoresistive sensing units 200b in series and in parallel. In other embodiments, optionally, the push magnetoresistive sensing unit string may be formed by connecting a plurality of push magnetoresistive sensing units in series, and the pull magnetoresistive sensing unit string is formed by connecting a plurality of pull magnetoresistive sensing units in series; or, further optionally, the push magnetoresistive sensing unit string may be formed by connecting the plurality of push magnetoresistive sensing units in parallel, and the pull magnetoresistive sensing unit string is formed by connecting the plurality of pull magnetoresistive sensing units in parallel. It is not limited to this.

Exemplarily, as shown in FIG. 2 and FIG. 3, optionally, the shape anisotropic demagnetizing field of the free layer is determined by shape anisotropy factors (Nx, Ny), and the magnetocrystalline anisotropic field of the free layer is determined by a magnetocrystalline anisotropy constant K1; $Nx=Ny+K1/M_s^2$, $M_s$ represents a saturation magnetic moment of the free layer, Nx represents an X-direction shape anisotropy factor, and Ny represents a Y-direction shape anisotropy factor.

Optionally, the shape anisotropic demagnetizing field of the free layer is determined by the shape anisotropy factors (Nx, Ny), and the magnetocrystalline anisotropic field of the free layer is determined by the magnetocrystalline anisotropy constant K1; for the push magnetoresistive sensing unit, $Nx=Ny+K1/M_s^2+2*H_N/M_s$; for the pull magnetoresistive sensing unit, $Nx=Ny+K1/M_s^2-2*H_N/M_s$, $M_s$ represents the saturation magnetic moment of the free layer, Nx represents the X-direction shape anisotropy factor, Ny represents the Y-direction shape anisotropy factor, and $H_N$ represents the Neel coupling magnetic field of the free layer.

In this embodiment, analysis is started from matrix representation of the magnetocrystalline anisotropic field $H_k$ and the shape anisotropic demagnetizing field $H_d$ to describe the process of achieving compensation by the magnetocrystalline anisotropic field $H_k$ and the shape anisotropic demagnetizing field $H_d$; and the shape anisotropic demagnetizing field refers to a magnetic shape anisotropic magnetic field.

Mathematically, the magnetocrystalline anisotropic field $H_k$ and the shape anisotropic demagnetizing field 1-d may be represented by an anisotropy tensor matrix, and the anisotropy tensor matrix is shown as the following formula (1):

$$\overleftrightarrow{D} = \begin{bmatrix} D_{xx} & D_{xy} & D_{xz} \\ D_{xy} & D_{yy} & D_{yz} \\ D_{xz} & D_{yz} & D_{zz} \end{bmatrix}. \tag{1}$$

By transforming coordinates in the main axis direction, the anisotropy tensor matrix (1) may be transformed into a diagonal matrix, and the diagonal matrix is shown as the following formula (2):

$$\overleftrightarrow{D} = \begin{bmatrix} D_x & 0 & 0 \\ 0 & D_y & 0 \\ 0 & 0 & D_z \end{bmatrix}. \tag{2}$$

Geometrically, the anisotropy tensor matrix (1) may be described by an ellipsoid, and the free layer of the push magnetoresistive sensing unit and the free layer of the pull magnetoresistive sensing unit are equivalent to a special oblate ellipsoid compressed in the Z direction.

Therefore, theoretically, the mutual compensation of $H_d$ and $H_k$ may be achieved as long as the sum of a matrix $[D]_1$ of the magnetocrystalline anisotropic field $H_k$ and a matrix $[D]_2$ of the shape anisotropic demagnetizing field $H_d$ is equal to 0, namely, the $[D]_1+[D]_2=0$ matrix; and in terms of in energy, the sum of magnetocrystalline anisotropic energy of the magnetocrystalline anisotropic field $H_k$ and magnetic shape anisotropic energy of the shape anisotropic demagnetizing field $H_d$ is 0.

For magnetocrystalline anisotropic energy and magnetic shape anisotropic energy, the expression is shown in the following formula (3):

$$
\begin{aligned}
E_A &= -\vec{M} \cdot \overleftrightarrow{D} \cdot \vec{M} = -[ m_x \quad m_y \quad m_z ] \cdot \begin{bmatrix} D_x & 0 & 0 \\ 0 & D_y & 0 \\ 0 & 0 & D_z \end{bmatrix} \cdot \begin{bmatrix} m_x \\ m_y \\ m_z \end{bmatrix} \\
&= -M^2 [\cos\theta_1 \quad \cos\theta_2 \quad \cos\theta_3 ] \cdot \begin{bmatrix} D_x & 0 & 0 \\ 0 & D_y & 0 \\ 0 & 0 & D_z \end{bmatrix} \cdot \begin{bmatrix} \cos\theta_1 \\ \cos\theta_2 \\ \cos\theta_2 \end{bmatrix} \cdot \\
&= -M^2 \cdot \left( D_x \cdot \cos^2\theta_1 + D_y \cdot \cos^2\theta_2 + D_z \cdot \cos^2\theta_3 \right)
\end{aligned} \tag{3}
$$

In the formula (3), M represents vector magnetic moment and may be expressed as three components of $m_x$, my, and $m_z$; $\theta_1$ represents a vector included angle between M and the X axis; $\theta_2$ represents a vector included angle between M and the Y axis; $\theta_3$ represents a vector included angle between M and the Z axis; and $\theta_1$, $\theta_2$, and $\theta_3$ meet the relational expression (4):

$$\cos^2\theta_1 + \cos^2\theta_2 + \cos^2\theta_3 = 1. \tag{4}$$

According to that the free layer of the push magnetoresistive sensing unit is equivalent to the special oblate ellipsoid compressed in the Z direction, and the free layer of the pull magnetoresistive sensing unit is equivalent to the special oblate ellipsoid compressed in the Z direction, Dx=Dz in the diagonal matrix formula (2) is set, and the formula (3) is converted into the following formula (5):

$$
\begin{aligned}
E_A &= -M^2 \cdot \left( D_x \cdot \cos^2\theta_1 + D_y \cdot \cos^2\theta_2 + D_z \cdot \cos^2\theta_3 \right) \\
&= -M^2 \cdot \left( D_x \cdot \left( \cos^2\theta_1 + \cos^2\theta_3 \right) + D_y \cdot \cos^2\theta_2 \right) \\
&= -M^2 \cdot \left( D_x \cdot \left( 1 - \cos^2\theta_2 \right) + D_y \cdot \cos^2\theta_2 \right) \\
&= -M^2 \cdot \left( D_x \cdot \sin^2\theta_2 + D_y \cdot \left( 1 - \sin^2\theta_2 \right) \right) \\
&= -M^2 \cdot \left( D_x \cdot \sin^2\theta_2 + D_y - D_y \cdot \sin^2\theta_2 \right) \\
&= -M^2 \cdot \left( D_x - D_y \right) \cdot \sin^2\theta_2 - M^2 \cdot D_y
\end{aligned} \tag{5}
$$

On the other hand, another expression of magnetocrystalline anisotropy is shown in the formula (6):

$$E_A = K_1 \cdot \sin^2\theta_2 + K_0. \tag{6}$$

In the formula (6), $K_1$ and $K_0$ are magnetocrystalline anisotropy constants, and the equations (5) and (6) are compared to obtain a formula (7):

$$K_1 = -M^2 \cdot (Dx - Dy). \tag{7}$$

In practical work, for the magnetocrystalline anisotropic field, the factor is expressed by a parameter $K_1$; and for the shape anisotropic demagnetizing field, the shape anisotropic demagnetizing factor is expressed by Nx (Dx), Ny (Dy) and Nz (Dz). The sum of magnetocrystalline anisotropic energy and magnetic shape anisotropic energy is 0, which is a condition for mutual compensation of $H_k$ and $H_d$. As the directions of the magnetocrystalline anisotropic energy and the magnetic shape anisotropic energy are opposite, a following formula (8) is obtained:

$$K_1 \cdot \sin^2\theta_2 + K_0 - M^2 \cdot (Nx - Ny) \cdot \sin^2\theta_2 = 0. \qquad (8)$$

After the formula (8) is simplified, a formula (9) is obtained:

$$Nx = 2K_1/M^2 + Ny. \qquad (9)$$

Therefore, the magnetocrystalline anisotropic field $H_k$ is expressed by a formula (10), and the shape anisotropic demagnetizing field $H_d$ is expressed by a formula (11):

$$H_k = 2K_1/M, \qquad (10)$$

$$H_d = M \cdot (Nx - Ny). \qquad (11)$$

The condition for mutual compensation of $H_d$ and $H_k$ is shown in a formula (12):

$$H_d = M \cdot (Nx - Ny) = H_k. \qquad (12)$$

Optionally, the magnetocrystalline anisotropic field $H_k$ is smaller than 20 Oe; the ratio Lx/Ly of the short axis to the long axis ranges from 0.5<Lx/Ly<0.95, the thickness Lz ranges from 5 nm<Lz<200 nm, and the short axis Lx ranges from 0.5 μm<Lx<50 μm; and the difference between the orientation angle of the shape anisotropic demagnetizing field $H_d$ and the orientation angle of the magnetocrystalline anisotropic field $H_k$ is 90°.

Permalloy NiFe is taken an example below to describe the design of the size (Lx, Ly, Lz) of the ellipsoid of the free layer and a thin film formed by permalloy under the condition that performance parameters of soft magnetic materials ($H_k$, $M_s$) are known, wherein $H_k$=20 Oe, $M_s$=10000 G.

The long axis of the oval free layer is Ly, the short axis is Lx, the thickness is Lz, and specifically, if Ly>Lx>>Lz, the calculation formula of demagnetizing factors Nx, Ny and Nz is shown in following formulas (13-16):

$$N_y = \frac{L_z}{L_y}\left(1 - e^2\right)^{\frac{1}{2}}\frac{K - E}{e^2}, \qquad (13)$$

$$N_x = \frac{L_z}{L_y}\frac{E - \left(1 - e^2\right)K}{e^2\left(1 - e^2\right)^{\frac{1}{2}}}, \qquad (14)$$

$$N_z = 1 - \frac{L_z E}{L_y\left(1 - e^2\right)^{\frac{1}{2}}}, \qquad (15)$$

-continued $$e = \left(1 - \frac{L_x}{L_y}\right)^{\frac{1}{2}}. \qquad (16)$$

K and E are complete oval integral terms, the input parameter is e, and the relational graph of (Lx, Ly, Lz) vs $H_d$ may be solved by substituting into the formula (12).

As described above, as shown in FIG. 2, it is assumed that the magnetoresistive angle sensor is of a single-domain structure, the easy magnetization axis direction (EA) is the X-axis direction, the direction of the shape anisotropic demagnetizing field $H_d$ is the −X direction under a zero magnetic field, H is the external magnetic field, and the direction of the magnetic moment M is consistent with the direction of the external magnetic field H.

FIG. 6 is a (Lx/Ly)–Lx two-dimensional diagram of a free layer having different Lz values of an oval magnetoresistive sensing unit. As shown in FIG. 6, optionally, the shape anisotropic demagnetizing field $H_d$ and the magnetocrystalline anisotropic field $H_k$ of the free layer meet $H_d$=$H_k$=20 Oe; Lz is equally spaced from 1 nm to 50 nm to form ten curves, and corresponding Lz value of each curve is 1+49/9*(n−1) nm, namely, n is an integer and is shown as 1≤n≤10; if n=1, the corresponding Lz value of the first curve is 1 nm; if n=2, the corresponding Lz value of the second curve is about 6.44 nm, and if n=3, the corresponding Lz value of the third curve is about 11.88 nm, and so on, if n=10, the corresponding Lz value of the tenth curve is 50 nm. It can be seen that the Lx/Ly ranges from 0<Lx/Ly<1; for each Lz value, Lx has a maximum value; for each Lx value, there is only one corresponding Lx/Ly; and as the Lx increases, Lx/Ly is reduced, namely, it is also needed to correspondingly increase Ly.

Figure 7:
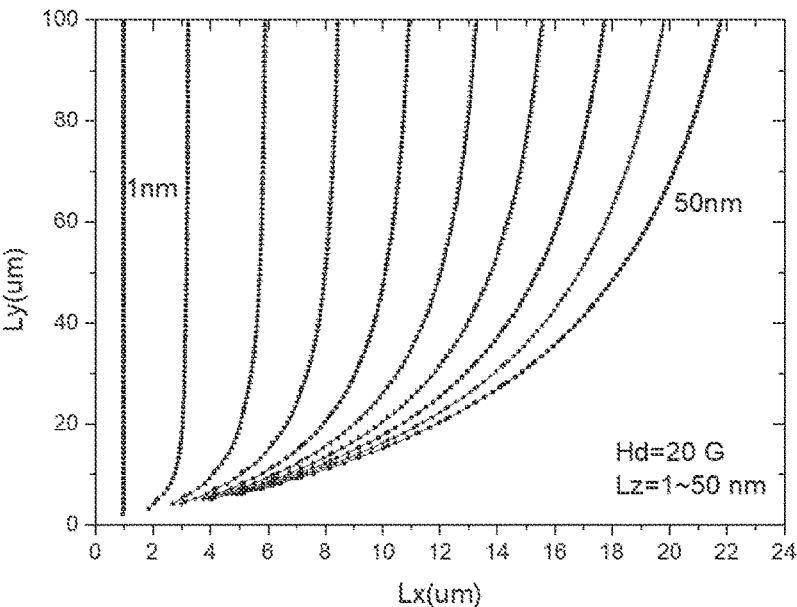
FIG. 7 is an Lx-Ly two-dimensional diagram of free layers having different Lz values in an oval magnetoresistive sensing unit.

FIG. 7 is an Lx-Ly two-dimensional diagram of free layers having different Lz values in an oval magnetoresistive sensing unit. As shown in FIG. 7, optionally, the shape anisotropic demagnetizing field $H_d$ and the magnetocrystalline anisotropic field $H_k$ of the free layer meet the formula $H_d$=$H_k$=20 Oe; Lz is equally spaced from 1 nm to 50 nm to form ten curves, and corresponding Lz value of each curve is 1+49/9*(n−1) nm, namely n is an integer and shown as 1≤n≤10; if n=1, the corresponding Lz of the first curve is 1 nm; if n=2, the corresponding Lz value of the second curve is about 6.44 nm; if n=3, the corresponding Lz value of the third curve is about 11.88 nm, and so on, if n=10, the corresponding Lz value of the tenth curve is 50 nm. It can be seen that as Lz increases, the Lx value range is gradually widened, and when Lz is close to 1 nm, the Ly/Lx value range is changed drastically relative to Lz=50 nm.

For Lz=50 nm, one value is shown as: Lx=14.36 μm, Ly=28.35 μm, Lz=50 nm, Nx=0.001116855, Ny=0.003114851, Nz=0.995768293, $H_d$≈20 Oe=$H_k$, in the inequality H>$H_N$+$H_s$+$H_k$+$H_s$ of the external magnetic field H, if $H_d$+$H_k$=0, mutual compensation is achieved; and if H>$H_N$+$H_s$, and the amplitude of H is greatly reduced.

Figure 8:
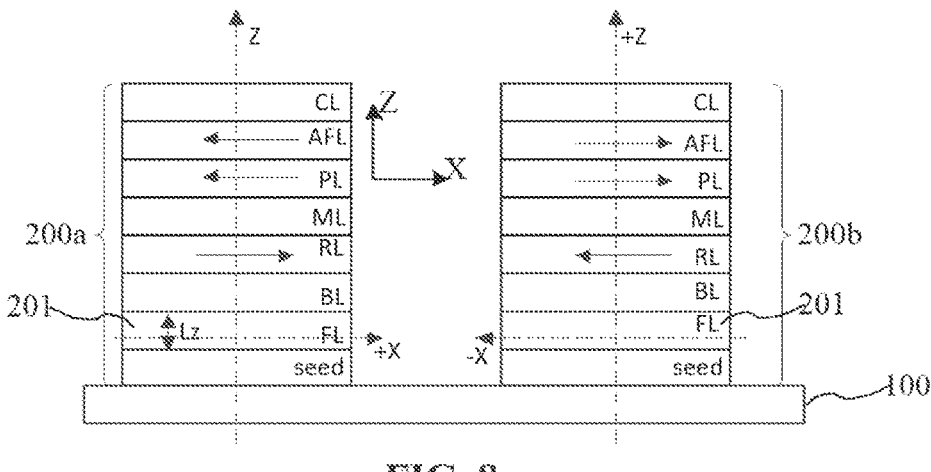
FIG. 8 is a schematic diagram of a multi-layer stacking structure in a magnetoresistive sensing unit.

Exemplarily, FIG. 8 is a schematic diagram of a multi-layer stacking structure in a magnetoresistive sensing unit. As shown in FIG. 8, optionally, along the direction in which the substrate 100 points to the magnetoresistive sensing unit 200 (the same as +Z direction), the multi-layer thin film structure includes the seed layer (seed), the free layer (FL), the barrier layer (BL), the reference layer (RL), the metal layer (ML), the pinning layer (PL), the antiferromagnetic layer (AFL) and the insulating layer (CL). For the push magnetoresistive sensing unit 200a, the free layer 201 includes the +X-direction magnetocrystalline anisotropic field $H_k$; the magnetic moment direction of the reference layer (RL) is the +X direction; the magnetic moment direction of the pinning layer (PL) is the −X direction; and the magnetic moment direction of the antiferromagnetic layer (AFL) is the −X direction. For the pull magnetoresistive sensing unit 200b, the free layer 201 includes the −X-direction magnetocrystalline anisotropic field $H_k$; the magnetic moment direction of the reference layer (RL) is the −X direction; the magnetic moment direction of the pinning layer (PL) is the +X direction; and the magnetic moment direction of the antiferromagnetic layer (AFL) is the +X direction.

Exemplarily, as shown in FIG. 4, optionally, along the direction in which the substrate 100 points to the magnetoresistive sensing unit 200 (the same as +Z direction), the multi-layer thin film structure includes the seed layer (seed), the antiferromagnetic layer (AFL), the pinning layer (PL), the metal layer (ML), the reference layer (RL), the barrier layer (BL), the free layer (FL) and the insulating layer (CL); and the reference layer (RL) is flattened by off-axis ion beam milling. For the push magnetoresistive sensing unit 200a, the free layer 201 includes the +X-direction magnetocrystalline anisotropic field $H_k$; the magnetic moment direction of the reference layer (RL) is the +X direction; the magnetic moment direction of the pinning layer (PL) is the −X direction; and the magnetic moment direction of the antiferromagnetic layer (AFL) is the −X direction. For the pull magnetoresistive sensing unit 200b, the free layer 201 includes the −X-direction magnetocrystalline anisotropic field $H_k$; the magnetic moment direction of the reference layer (RL) is the −X direction; the magnetic moment direction of the pinning layer (PL) is the +X direction; and the magnetic moment direction of the antiferromagnetic layer (AFL) is the +X direction. The insulating layer (CL) may also be regarded as a cap layer.

Optionally, the reference layer (RL) is of a double-layer composite structure or an SAF multi-layer composite structure. Optionally, the barrier layer is a conductive layer prepared from ruthenium or copper, or the barrier layer is an insulating layer prepared from aluminum oxide or magnesium oxide, and the free layer is a multi-layer thin film composed of two or more alloys of ferronickel, cobalt-iron-boron and cobalt-iron.

Figure 9:
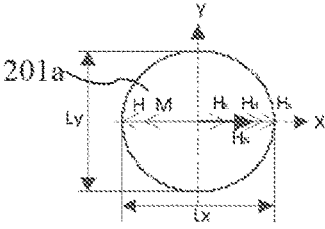
FIG. 9 is a magnetization diagram of a free layer in a push magnetoresistive sensing unit according to an embodiment of the present invention.

FIG. 9 is a magnetization diagram of free layers in a push magnetoresistive sensing unit according to an embodiment of the present invention; and FIG. 10 is a magnetization diagram of free layers in a pull magnetoresistive sensing unit according to an embodiment of the present invention. As shown in FIG. 9 and FIG. 10, optionally, the long axis Ly of the free layer is close to the short axis Lx, that is, the free layer 201 is approximately round. Optionally, the magnetoresistive sensing unit in the magnetoresistive angle sensor is the push-pull magnetoresistive sensing unit, the magnetization diagram of the push magnetoresistive sensing unit 200a in FIG. 4 and the magnetization diagram of the push magnetoresistive sensing unit 200a in FIG. 8 are shown in FIG. 9; and the magnetization diagram of the pull magnetoresistive sensing unit 200b in FIG. 4 and the magnetization diagram of the pull magnetoresistive sensing unit 200b in FIG. 8 are shown in FIG. 10.

A stack of the reference layer (RL), the barrier layer (BL) and the free layer (FL) in the magnetoresistive sensing unit form a tunnel junction unit, and the position of the tunnel junction unit is different according to the relative position change of the pinning layer (PL) in the magnetoresistive sensing unit. The magnetoresistive sensing unit shown in FIG. 4 can be understood as a bottom-pinned multi-layer thin film stacking structure, and the tunnel junction unit is located on the bottom-pinned multi-layer thin film stacking structure, namely, the substrate 100, the seed layer (seed), the antiferromagnetic layer (AFL), the pinning layer (PL), the metal layer (ML), the reference layer (RL), the barrier layer (BL), the free layer (FL) and the cap layer (CL) 10 are sequentially stacked. The magnetoresistive sensing unit shown in FIG. 8 can be understood as a top-pinned multi-layer thin film stacking structure, and the tunnel junction unit is located between the top-pinned multi-layer thin film stacking structure and the substrate 100, namely, the substrate 100, the seed layer (seed), the free layer (FL), the barrier layer (BL), the reference layer (RL), the metal layer (ML), the pinning layer (PL), the antiferromagnetic layer (AFL) and the cap layer (CL) 10 are sequentially stacked.

The antiferromagnetic layers (AFL) of the push magnetoresistive sensing unit 200a and the pull magnetoresistive sensing unit 200b have opposite positive and negative X-direction magnetic moment directions; a push pinning layer (PL) and a pull pinning layer (PL) also have opposite appositive and negative X-direction magnetic moment directions; the push pinning layer (PL), a push metal layer (ML) and a push reference layer (RL) form an SAF structure of the push magnetoresistive sensing unit 200a through the RKKY effect, and the pull pinning layer (PL), a pull metal layer (ML) and a pull reference layer (RL) form an SAF multi-layer composite structure of the pull magnetoresistive sensing unit 200b through the RKKY effect, so that it is guaranteed that the push reference layer (RL) and the pull reference layer (RL) have opposite −X and +X-direction magnetic moment directions.

Optionally, if the barrier layer (BL) is $Al_2O_3$ or MgO, the magnetoresistive sensing unit is a TMR unit; and optionally, if the barrier layer (BL) is a metal layer Ru or Cu, the magnetoresistive sensing unit is a GMR unit.

As shown in FIG. 9 and FIG. 10, when the free layer 201a of the push magnetoresistive sensing unit and the free layer 201b of the pull magnetoresistive sensing unit are of a round structure, the anisotropic field is 0, that is, the magnetic moments in different directions are distributed on the free layer 201a and the free layer 201b, and the isotropic characteristic is achieved. Then, the maximum magnetic field H value required when an external magnetic field H rotates by 0-360° on the free layer 201a and the free layer 201b is evaluated.

As shown in FIG. 9, $H_N$ is the Neel coupling magnetic field between a free layer (FL) 201a and the push reference layer (RL), the direction is consistent with the magnetic moment direction of the push reference layer (RL), namely the +X direction, and the direction cannot change along with the external magnetic field H. When the external magnetic field H is in the −X direction, there is a magnetic moment in the +X direction on the push free layer (FL) 201a; and the anisotropic field $H_k$ of the external magnetic field H is determined by materials, the direction is the +X direction, and at the moment, the demagnetizing field $H_d$ is obviously in the +X direction. In order to enable all magnetic moment on the push free layer (FL) 201a to be turned to the −X direction, the needed maximum magnetic field value is equal to the sum of the values of the Neel magnetic field HN, the demagnetizing field $H_d$, the anisotropic field $H_k$ and the material saturation magnetic field $H_s$, and at the moment, the magnetic moment M of the external magnetic field H is consistent with the magnetic moment M of the push free layer (FL) 201a, namely, $H > HN + H_d + H_k + H_s$.

Similarly, as shown in FIG. 10, for a pull free layer (FL) 201b of the pull magnetoresistive sensing unit, when the external magnetic field H is in the +X direction, there is a maximum magnetic field value, shown as H>HN+$H_d$+$H_k$+$H_s$.

In conclusion, the demagnetizing factor of the round pull free layer (FL) 201a and the pull free layer (FL) 201b may be expressed as:

$$Hd = \{sqrt(t^2 + R^2) - R\}/2t,$$

t represents the film thickness of the free layers; R represents the round radius; and for the permalloy thin film, the thickness is shown as t≈10 nm, R≈5000 nm, $u_0M_s$-1T, $H_d$≈16 Oe.

The typical value of the Neel coupling field HN is within the range of 1-10 Oe, and the Neel coupling field HN also needs to be overcome by an external magnetic field H to saturate the free layer. Roughly, for the round free layer, the lowest possible magnetic field intensity of the external magnetic field H is generally required to be greater than 50 Oe, and at the moment, H>>$H_s$.

In order to reduce the value of the external magnetic field H, the values of HN, $H_d$ and $H_k$ may be reduced; and under an ideal condition, the HN may be as small as possible by adjusting the deposition process of the FL layer film and the PL layer film to minimize the roughness between the FL layer and the PL layer. Based on this, optionally, the multi-layer thin film stacking structure of the magnetoresistive sensing unit is a top-pinned multi-layer thin film stacking structure, or optionally, the multi-layer thin film stacking structure of the magnetoresistive sensing unit is a bottom-pinned multi-layer thin film stacking structure. Before the barrier layer is deposited, the push reference layer and the pull reference layer are flattened to reduce the roughness; and the optionally, the flattening process may be off-axis ion beam milling.

For the embodiment above, no matter whether the free layer is approximately round or oval, the mutual compensation of $H_d$ and $H_k$ is achieved in the following mode: the free layer is processed by a magnetic field annealing processing technology, or the free layer is grown through a sputtering film growing technology with a bias magnetic field; the formed free layer film may have a uniaxial magnetocrystalline anisotropic field $H_k$, and anisotropy is in the specific direction; and on the other hand, the free layer is arranged to be in the oval shape instead of a round shape, the shape anisotropy annealing field $H_d$ in the specific direction is obtained by setting the size of the long axis Ly and the size of the short axis Lx of the oval, and the sum of $H_k$ and $H_N$ is compensated through the Ha; and at the moment, $H_N$ may be in the X direction and may also be in the Y direction according to the difference of the magnetic moment directions of the reference layer (RL), and therefore the $H_d$ can compensate for the $H_k$ and $H_N$.

When the magnetization direction of the reference layer (RL) is the X direction, as shown in FIG. 11a-FIG. 11d, FIG. 11a is an X-Y plane magnetization diagram of an oval push free layer; FIG. 11b is an X-Z plane magnetization diagram of an oval push free layer; FIG. 11c is an X-Y plane magnetization graph of an oval pull free layer; and FIG. 11d is an X-Z plane magnetization graph of an oval pull free layer. HN is equivalent to a bias magnetic field added in the X direction, and at the moment, $H_d$ may still be obtained by adjusting the Lx, Ly and Lz sizes of the oval free pushing layers 201c and 201d and used for compensating the sum of HN and $H_k$.

At the moment, under the combined action of $H_N$, $H_d$ and $H_k$, the total energy E(θ) of the free layer is expressed as the following formula (17):

$$E(\theta) = -(H_x \pm H_N) \cdot M \cdot \cos \theta - \qquad (17)$$
$$H_y \cdot M \cdot \sin \theta + [K_1 - M^2 \cdot (N_y - N_x)] \cdot \sin^2\theta.$$

The positive and negative signs correspond to the free layers 201c and 201d of the push magnetoresistive sensing unit and the pull magnetoresistive sensing unit respectively. That is, the free layer 201c of the push magnetoresistive sensing unit is E(θ)=−(Hx+$H_N$)·M·cos θ−Hy·M·sin θ+[K1−$M^2$·(Ny−Nx)]·$\sin^2$θ], and the free layer 201d of the pull magnetoresistive sensing unit is E(θ)=−(Hx−$H_N$)·M·cos θ−Hy·M·sin θ+[K1−$M^2$·(Ny−Nx)]· $\sin^2$θ]; or the free layer 201d of the pull magnetoresistive sensing unit is E(θ)=−(Hx+$H_N$)·M·cos θ−Hy·M·sin θ+[K1−$M^2$·(Ny−Nx)]·$\sin^2$θ], and the free layer 201c of the push magnetoresistive sensing unit is E(θ)=−(Hx−$H_N$)·M·cos θ−Hy·

$$M \cdot \sin\theta + [K1 - M^2 \cdot (N_y - N_x)] \cdot \sin^2\theta].$$

When the magnetic moment of the saturation magnetic field Hs is in the X direction and the Y direction, the total energy E(θ) of the free layer has the same numerical value, namely the following formula (18) is met:

$$E(0) = E(90). \qquad (18)$$

At the moment, due to mutual compensation of $H_N$, $H_d$ and Hk, only one item of $H_s$ is left in the external magnetic field H expression (H>$H_N$+$H_d$+$H_k$+$H_s$), namely the external magnetic field H expression is H>$H_s$, and H meets: Hx=Hy=$H_s$ (19).

Hx=$H_s$, Hy=0 is substituted into E(θ); Hy=$H_s$, Hx=0 is substituted into E(90). A formula (20) is obtained according to the formula (18):

$$(\pm H_N) \cdot M = -[K_1 - M^2 \cdot (N_y - N_x)]. \qquad (20)$$

After the formula (20) is simplified, a relational expression (21) meeting mutual compensation of $H_N$, $H_k$, and $H_d$ is obtained:

$$N_x = N_y + 2K_1/M^2 \pm \frac{2H_N}{M}. \qquad (21)$$

When the magnetization direction of the reference layer (RL) is in the Y direction, namely $H_N$ is in the Y direction, the total energy E(θ) of the free layer meets the following formula (22):

$$E(\theta) = -H_x \cdot M \cdot \cos \theta - \qquad (22)$$
$$(H_y \pm H_N) \cdot M \cdot \sin \theta + [K_1 - M^2 \cdot (N_y - N_x)] \cdot \sin^2\theta.$$

The positive and negative signs correspond to the free layers 201c and 201d of the push magnetoresistive sensing unit and the pull magnetoresistive sensing unit respectively.

When the magnetic moment of the saturation magnetic field H, is in the X direction and the Y direction, the total energy E(θ) of the free layer has the same numerical value, namely E(θ)=E(90).

After the formula (22) is simplified, a relational expression (23) meeting mutual compensation of $H_N$, $H_k$, and $H_d$ is obtained:

$$N_x = N_y + 2K_1/M^2 \mp \frac{2H_N}{M}. \qquad (23)$$

Optionally, the shape anisotropic demagnetizing field of the free layer is determined by the shape anisotropy factors (Nx, Ny), and the magnetocrystalline anisotropic field of the free layer is determined by the magnetocrystalline anisotropy constant K1.

For the push magnetoresistive sensing unit, $Nx=Ny+K1/M_s^2+2*H_N/M_s$, and for the pull magnetoresistive sensing unit, $Nx=Ny+K1/M_s^2=2*H_N/M_s$;

M$_s$ represents the saturation magnetic moment of the free layer, Nx represents the X-direction shape anisotropy factor, Ny represents the Y-direction shape anisotropy factor, and $H_N$ represents the Neel coupling magnetic field of the free layer.

Similarly, taking permalloy NiFe as an example, $H_k$=20 Oe, M=10000 G, and the typical value of the Neel coupling field $H_N$ is within the range of 1-10 Oe. If $H_N$=5 Oe, for the push magnetoresistive sensing unit, $H_k+H_N$=25 Oe, and for the pull magnetoresistive sensing unit, $H_k-H_N$=15 Oe, so the push magnetoresistive sensing unit and the pull magnetoresistive sensing unit have different Lx and Ly sizes respectively.

As shown in FIG. 12a-FIG. 12d, FIG. 12a is an X-Y plane magnetization graph of an oval push free layer; FIG. 12b is an X-Z plane magnetization diagram of an oval push free layer; FIG. 12c is an X-Y plane magnetization diagram of an oval pull free layer; FIG. 12d is an X-Z plane magnetization diagram of an oval pull free layer. If the sizes of magneto-pushing resistance sensing units are assumed to be $L_{x1}$ and $L_{y1}$, and the sizes of magneto-pulling resistance sensing units are assumed to be $L_{x2}$ and $L_{y2}$, the following relational expression (24) exists because the resistances of the magneto-pushing resistance sensing units need to be the same, that is, the areas need to be the same:

$$L_{x1} \cdot L_{y1} = L_{x2} \cdot L_{y2}. \qquad (24)$$

Figure 13:
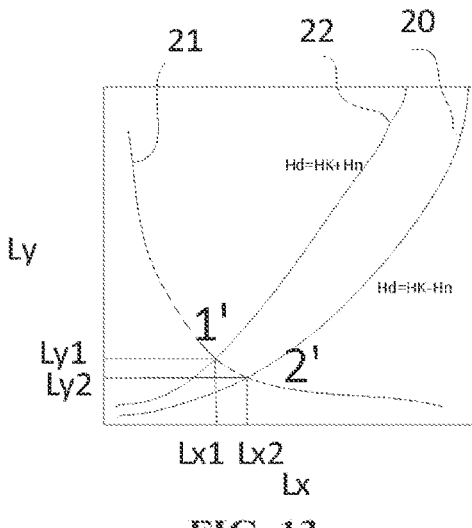
FIG. 13 is an isogram of $H_d$ in Lx-Ly two-dimensional coordinates.

As shown in FIG. 13, under the condition that Lz is known, $L_{x1}$ and $L_{y1}$ are obtained through an isogram of $H_d$ in Lx-Ly two-dimensional coordinates. $L_{x1}$ and $L_{y1}$ meet an equivalent curve 22 of $H_d=H_k+H_N$, and $L_{x2}$ and $L_{y2}$ meet an equivalent curve 20 of $H_d=H_k-H_N$. Then, a hyperbola 21 of Lx*Ly=$L_{x1}*L_{y1}$ is made through ($L_{x1}$, $L_{y1}$), and the intersection point of the hyperbola 21 and the equivalent curve 20 is another point (Lx2, Ly2). In the same way. ($L_{x3}$, $L_{y3}$) and ($L_{x4}$, $L_{y4}$) corresponding to $H_N$ in the Y direction may be solved.

Figure 14:
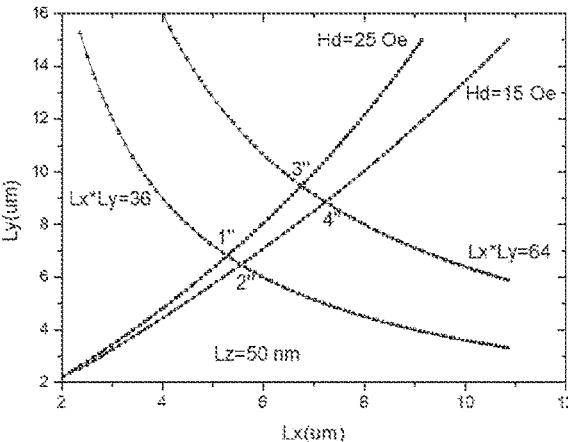
FIG. 14 is a size selection diagram of a push magnetoresistive sensing unit and a pull magnetoresistive sensing unit.

FIG. 14 is a size selection diagram of a push magnetoresistive sensing unit and a pull magnetoresistive sensing unit. Two contour lines $H_d$=25 Oe and $H_d$=15 Oe are selected; the $H_d$=25 Oe and $H_d$=15 Oe intersect with one hyperbola Lx*Ly=36 at (1, 2), and $H_d$=25 Oe and $H_d$=15 Oe intersect with the other hyperbola Lx*Ly=64 at (3, 4). The corresponding Lx and Ly data tables see Table 1.

TABLE 1

| Lx (um) | Ly (um) | Lx*Ly (um*um) | H$_d$ (Oe) |
|---|---|---|---|
| 5.22808 | 6.72222 | 35.14433 | 25 |
| 5.3192 | 6.87273 | 36.55744 | |
| 5.51825 | 6.42121 | 35.43387 | 20 |
| 5.62978 | 6.57172 | 36.99734 | |

| Lx (um) | Lx (um) | Lx*Ly (um*um) | H$_d$ (Oe) |
|---|---|---|---|
| 6.72868 | 9.43131 | 63.46026 | 25 |
| 6.80542 | 9.58182 | 65.20826 | |
| 7.20738 | 8.82929 | 63.6361 | 20 |
| 7.30707 | 8.9798 | 65.61604 | |

As shown in the table above, when the corresponding area is Lx*Ly=36 μm*μm, the size of the push magnetoresistive sensing unit is shown as 5.22808<$L_{x1}$<5.3192, 6.72222<Ly<6.87273, and the size of the pull magnetoresistive sensing unit is: 5.51825<$L_{x1}$<5.62978, 6.42121<Ly<6.57172.

When the corresponding area is Lx*Ly=64 μm*μm the size of the push magnetoresistive sensing unit is shown as 6.72868<$L_{x1}$<6.80542, 9.43131<Ly<9.58182, and the size of the pull magnetoresistive sensing unit is: 7.20738<$L_{x1}$<7.30707, 8.82929<Ly<8.9798.

Figure 15:
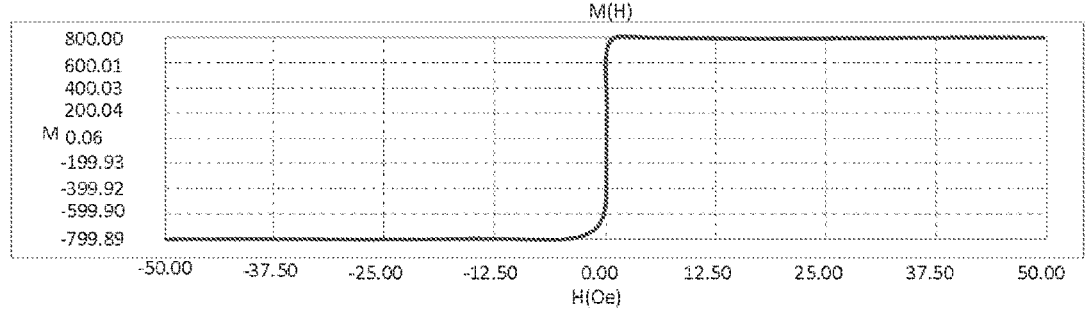
FIG. 15 is an M-H curve corresponding to size and material performances of an oval free layer.
Figure 16:
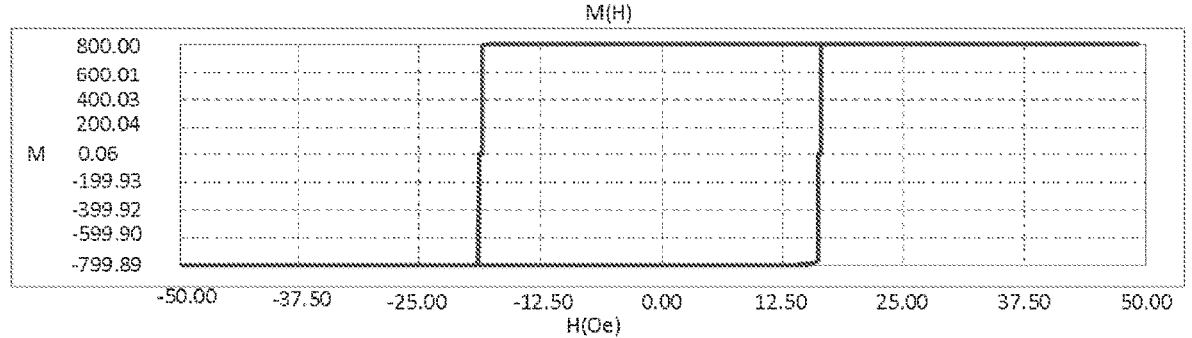
FIG. 16 is an M-H curve corresponding to size and material performances of a circular free layer.

FIG. 15 and FIG. 16 show M-H curves corresponding to two sizes and material performances of an oval free layer and a round free layer respectively. As shown in FIG. 15, because the effective anisotropic field of the low-magnetic-field magnetoresistive angle sensor is close to 0, namely $H_d$, $H_k$ and $H_N$ compensate for one another, the coercive force of an M-H loop is close to 0. As shown in FIG. 16, because the anisotropic field of the low-magnetic-field magnetoresistive angle sensor is mainly determined by $H_k$, there will be a rectangular M-H loop; meanwhile, due to the existence of $H_N$, the coercive force is $-H_k+H_N$ and $H_k-H_N$, and the M-H loop is asymmetric. It is to be noted that the Hy values corresponding to a push arm and a pull arm in the magnetoresistive angle sensor are opposite in direction. According to numerical simulation representation, H$_s$ may be reduced by selecting a correct Lx/Ly, and then an external magnetic field H similar to H$_s$ may be obtained.

As for any embodiment above, it is to be noted that the free layer has a magnetocrystalline anisotropic field $H_k$ in the same +X or −X direction, and also has a Neel coupling field $H_N$ in the opposite +X and −X directions; and the pinning layer (PL) has a pinning field H$_p$ in the opposite +X and −X directions. When the external magnetic field H rotates by 0-360° in the X-Y plane, the magnetocrystalline anisotropic field $H_k$ and the Neel coupling field $H_N$ are compensated by the FL layer shape anisotropic demagnetizing field $H_d$, so that the FL layer has an effective anisotropic field close to 0, and the external magnetic field H has a low magnetic field value close to the FL layer saturation magnetic field H$_s$. Therefore, the deflection angle of the PL layer may be effectively reduced, and the accuracy of angle measurement may be improved.

It can be understood that the condition that the free layer has the minimum saturation magnetic field H$_s$ is as follows: the shape anisotropy factor (Nx, Ny) of the demagnetizing field H$_d$ of the free layer and the magnetocrystalline anisotropy constant K1 of the magnetocrystalline anisotropic field $H_k$ are in the relation shown as $Nx=Ny+K1/M_s^2$, and $M_s$ represents the FL layer saturation magnetic moment.

Optionally, $|H_d|=|H_k|$, and the difference between orientation angles of $H_d$ and $H_k$ is 90°, that is, the magnetocrystalline anisotropy direction tends to the direction of forced magnetization intensity to the direction of the short axis.

In addition, under the condition that the directions of magnetic moments $M_s$ and H of the free layer (FL) are consistent, the external magnetic field H is reduced, the deflection angle of the pinning layer (PL) under the action of the external magnetic field H may be reduced, thus the deflection angle of the PL is prevented from being increased along with the increase of the amplitude of the H, and the measurement angle error is reduced. Therefore, the amplitude of the external magnetic field H is reduced, so that the deflection angle of the pinning layer (PL) is reduced; meanwhile, the magnetic moment $M_s$ of the free layer (FL) can be ensured to be in a saturated state in the H direction; moreover, the cost of a magnet may be reduced; and it has an important significance for improving the preparation of a TMR or GMR spin valve high-precision magnetoresistive angle sensor and reducing the cost.

It is to be noted that the above is only a preferred embodiment and technical principle of the present invention. Those skilled in the art will understand that the present invention is not limited to the specific embodiments described here, and can undergo various obvious changes, adjustments, combinations, and substitutions without departing from the scope of protection of the present invention. Therefore, although the present invention has been described in detail through the above embodiments, it is not limited to the above embodiments. Without departing from the concept of the present invention, it can also include more equivalent embodiments, and the scope of the present invention is determined by the scope of the attached claims.

The invention claimed is:

1. A low-magnetic-field magnetoresistive angle sensor, comprising:

a substrate located in an X-Y plane; and a magnetoresistive sensing unit located on the substrate, the magnetoresistive sensing unit comprising a multi-layer thin film structure, the multi-layer thin film structure comprising at least a stack of a free layer, a barrier layer, and a reference layer, wherein the magnetoresistive sensing unit has an oval shape; the oval-shaped free layer has a long axis Ly, a short axis Lx, and a thickness Lz; the free layer has a saturation magnetic field, a shape anisotropic demagnetizing field, and a magnetocrystalline anisotropic field in the X direction, and when an external magnetic field rotates by 0-360° in the X-Y plane, the magnetocrystalline anisotropic field is compensated by the shape anisotropic demagnetizing field to cause the effective anisotropic field of the free layer to be close to 0, such that the external magnetic field has a low working magnetic field value close to that of the saturation magnetic field of the free layer material.

2. The low-magnetic-field magnetoresistive angle sensor according to claim 1, wherein the magnetoresistive sensing unit comprises a push magnetoresistive sensing unit and a pull magnetoresistive sensing unit; a free layer of the push magnetoresistive sensing unit and a free layer of the pull magnetoresistive sensing unit have positive and negative X-direction Neel coupling magnetic fields, and the Neel coupling magnetic fields of the push magnetoresistive sensing unit and the pull magnetoresistive sensing unit are compensated by the magnetocrystalline anisotropic field and the shape anisotropic demagnetizing field of the corresponding free layers respectively.

3. The low-magnetic-field magnetoresistive angle sensor according to claim 2, wherein a plurality of push magnetoresistive sensing units are electrically connected to form a push magnetoresistive sensing unit string; a plurality of pull magnetoresistive sensing units are electrically connected to form a pull magnetoresistive sensing unit string; and the push magnetoresistive sensing unit string and the pull magnetoresistive sensing unit string are connected to form a push-pull magnetoresistive angle sensor of a full-bridge structure or a half-bridge structure.

4. The low-magnetic-field magnetoresistive angle sensor according to claim 1, wherein the shape anisotropic demagnetizing field of the free layer is determined by shape anisotropy factors (Nx, Ny), and the magnetocrystalline anisotropic field of the free layer is determined by a magnetocrystalline anisotropy constant K1; and $Nx=Ny+K1/M_s^2$, $M_s$ represents a saturation magnetic moment of the free layer, Nx represents an X-direction shape anisotropy factor, and Ny represents a Y-direction shape anisotropy factor.

5. The low-magnetic-field magnetoresistive angle sensor according to claim 2 or 3, wherein the shape anisotropic demagnetizing field of the free layer is determined by the shape anisotropy factors (Nx, Ny), and the magnetocrystalline anisotropic field of the free layer is determined by a magnetocrystalline anisotropy constant K1;

for the push magnetoresistive sensing unit, $Nx=Ny+K1/M_s^2+2^*H_N/M_s$, and for the pull magnetoresistive sensing unit, $Nx=Ny+K1/M_s^2-2^*H_N/M_s$, wherein $M_s$ represents a saturation magnetic moment of the free layer, Nx represents a X-direction shape anisotropy factor, Ny represents a Y-direction shape anisotropy factor, and $H_N$ represents the Neel coupling magnetic field of the free layer.

6. The low-magnetic-field magnetoresistive angle sensor according to claim 1, wherein the multi-layer thin film structure comprises a seed layer, the free layer, the barrier layer, the reference layer, a metal layer, a pinning layer, an antiferromagnetic layer and an insulating layer along the direction in which the substrate points to the magnetoresistive sensing unit.

7. The low-magnetic-field magnetoresistive angle sensor according to claim 1, wherein the multi-layer thin film structure comprises a seed layer, an antiferromagnetic layer, a pinning layer, a metal layer, the reference layer, the barrier layer, the free layer and an insulating layer along the direction in which the substrate points to the magnetoresistive sensing unit; and the reference layer is flattened by off-axis ion beam milling.

8. The low-magnetic-field magnetoresistive angle sensor according to claim 1, wherein the reference layer is of a double-layer composite structure or an SAF multi-layer composite structure.

9. The low-magnetic-field magnetoresistive angle sensor according to claim 1, wherein the barrier layer is a conductive layer prepared from ruthenium or copper, or the barrier layer is an insulating layer prepared from aluminum oxide or magnesium oxide, and the free layer is a multi-layer thin film composed of two or more alloys of ferronickel, cobalt-iron-boron and cobalt-iron.

10. The low-magnetic-field magnetoresistive angle sensor according to claim 1, wherein the magnetocrystalline anisotropic field is smaller than 20 Oe;

the ratio Lx/Ly of the short axis to the long axis is in the range of 0.5<Lx/Ly<0.95, the thickness Lz is in the range of 5 nm<Lz<200 nm, and the short axis Lx is in the range of 0.5 μm<Lx<50 μm; and the difference between the orientation angle of the shape anisotropic demagnetizing field and the orientation angle of the magnetocrystalline anisotropic field is 90°.

* * * * *